United States Patent
Arimura et al.

(10) Patent No.: US 11,075,083 B2
(45) Date of Patent: Jul. 27, 2021

(54) SI-PASSIVATED GE GATE STACK

(71) Applicant: IMEC VZW, Leuven (BE)

(72) Inventors: Hiroaki Arimura, Leuven (BE); Antony Premkumar Peter, Heverlee (BE); Hendrik F. W. Dekkers, Tienen (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/692,427

(22) Filed: Nov. 22, 2019

(65) Prior Publication Data
US 2020/0203168 A1 Jun. 25, 2020

(30) Foreign Application Priority Data

Dec. 21, 2018 (EP) .................................... 18215545

(51) Int. Cl.
*H01L 21/28* (2006.01)
*H01L 21/02* (2006.01)
*H01L 29/49* (2006.01)
*H01L 29/51* (2006.01)

(52) U.S. Cl.
CPC .... *H01L 21/28255* (2013.01); *H01L 21/0228* (2013.01); *H01L 21/02164* (2013.01); *H01L 21/02274* (2013.01); *H01L 29/4966* (2013.01); *H01L 29/513* (2013.01)

(58) Field of Classification Search
None
See application file for complete search history.

(56) References Cited

U.S. PATENT DOCUMENTS

| | | |
|---|---|---|
| 8,395,215 B2 | 3/2013 | Lin |
| 8,586,441 B1 | 11/2013 | Cai et al. |
| 9,093,264 B2 | 7/2015 | Ahmed |
| 9,252,281 B2 | 2/2016 | Ahn et al. |
| 9,647,090 B2 | 5/2017 | Wang et al. |
| 9,799,756 B1 | 10/2017 | Chan et al. |
| 2004/0038545 A1* | 2/2004 | Cheung ............ H01L 21/02304 438/709 |
| 2009/0302349 A1 | 12/2009 | Lee et al. |
| 2013/0115763 A1 | 5/2013 | Takamure et al. |
| 2013/0126986 A1 | 5/2013 | Brodsky et al. |
| 2017/0162686 A1 | 6/2017 | Arimura |

OTHER PUBLICATIONS

European Search Report, European Patent Application No. 18215545.7, dated Jul. 12, 2019, 7 pages.
Hattangady, S.V. et al., "Interface Engineering With Pseudormorphic Interlayers: Ge Metal-Insulator-Semiconductor Structures", Applied Physics Letters, vol. 57, No. 6, Aug. 1990, 3 pages.

(Continued)

*Primary Examiner* — Asok K Sarkar
(74) *Attorney, Agent, or Firm* — McDonnell Boehnen Hulbert & Berghoff LLP

(57) ABSTRACT

A method for forming a gate stack of a field-effect transistor includes depositing a Si capping layer on a Ge channel material (100). The method further includes depositing an oxide layer on the Si capping layer by a plasma enhanced deposition technique at a temperature less than or equal to 200° C., and a plasma power less than or equal to 100 W.

20 Claims, 2 Drawing Sheets

(56) References Cited

OTHER PUBLICATIONS

Reinking, D. et al., "Fabrication of High-Mobility Ge p-Channel MOSFETs on Si Substrates", Electronics Letters, vol. 35, No. 6, Mar. 18, 1999, 2 pages.

Groeseneken, G. et al., "BTI Reliability of Advanced Gate Stacks for Beyond-Silicon Devices: Challenges and Opportunities", 2014 IEEE International Electron Devices Meeting. IEEE, 2014, 4 pages.

Arimura, H. et al., "Ge nFET With High Electron Mobility and Superior PBTI Reliability Enabled by Monolayer-Si Surface Passivation and La-Induced Interface Dipole Formation", 2015 IEEE International Electron Devices Meeting (IEDM). IEEE, 2015, 4 pages.

Ren, P. et al., "Understanding Charge Traps for Optimizing Si-Passivated Ge nMOSFETs", 2016 Symposium on VLSI Technology Digest of Technical Papers, IEEE, 2016, 2 pages.

Arimura, H. et al., "Si-Passivated Ge nMOS Gate Stack With Low Dit and Dipole-Induced Superior PBTI Reliability Using 3D-Compartible ALD Caps and High-Pressure Anneal", 2016 IEEE International Electron Devices Meeting (IEDM). IEEE, 2016, 4 pages.

Sioncke, S. et al., "Si Cap Passivation for Ge nMOS Applications", Microelectronic Engineering, vol. 109, 2013, pp. 46-49.

Taoka, N. et al., "Physical Origins of Mobility Enhancement of Ge pMISFETs With Si Passivation Layers", 2009 Symposium on VLSI Technology Digest of Technical Papers, 2 pages.

Misra, D., "SiSiO2 Interface to High-k-Ge/III-V Interface; Passivation and Reliability", ECS Transactions, vol. 53, No. 3, 2013, pp. 69-84.

Loo, R. et al., "Epitaxial CVD Growth of Ultra-Thin Si Passivation Layers on Strained Ge Fin Structures", ECS Journal of Solid State Science and Technology, vol. 7, No. 2, 2018, pp. P66-P72.

Von Dipl.-ing, Kai-Sven Rover, "Herstellung and Charakterisierung dunner Gatedielektrika auf Germanium", Doctoral dissertation, Hannover: Universität, 2003, 139 pages, English translated Abstract.

* cited by examiner

SI-PASSIVATED GE GATE STACK

CROSS-REFERENCE TO RELATED APPLICATIONS

The present application is a non-provisional patent application claiming priority to European Patent Application No. 18215545.7, filed Dec. 21, 2018, the contents of which are hereby incorporated by reference.

FIELD OF THE DISCLOSURE

This application relates to Ge gate stacks for field-effect transistors and more particularly to Ge gate stacks using a Si capping layer for passivation of the Ge channel material.

BACKGROUND

Ge is a promising high-mobility channel material for high-performance complementary metal oxide semiconductor (CMOS) devices. However, several challenges need to be overcome before its potential can be fully unlocked.

Groeseneken et al. disclosed that, compared to GeOx-based passivation, Si-passivation of the Ge gate stack can lead to an improved bias temperature instability (BTI) reliability (GROESENEKEN, Guido, et al. BTI reliability of advanced gate stacks for Beyond-Silicon devices: Challenges and opportunities. In: Electron Devices Meeting (IEDM), 2014 IEEE International. IEEE, 2014. p. 34.4.1-34.4. 4).

However, for Si-passivated Ge n-channel metal-oxide-semiconductor field-effect transistors (NMOS), a trade-off between electron mobility and positive BTI (PBTI) was found, which is sensitive to the Si-cap thickness. To overcome this trade-off, Arimura et al. discovered that the electron mobility is increased by optimizing the Si thickness while significant improvement in PBTI reliability is realized by band engineering using La-induced interface dipole and defect passivation using laser annealing (ARIMURA, Hiroaki, et al. Ge nFET with high electron mobility and superior PBTI reliability enabled by monolayer-Si surface passivation and La-induced interface dipole formation. In: Electron Devices Meeting (IEDM), 2015 IEEE International. IEEE, 2015. p. 21.6. 1-21.6. 4).

Ren et al. revealed that two different types of electron traps can be identified in Ge nMOS: Type-A controlled by the $HfO_2$ layer thickness and Type-B by the Si growth induced Ge segregation (REN, Pengpeng, et al. Understanding charge traps for optimizing Si-passivated Ge nMOSFETs. In: VLSI Technology, 2016 IEEE Symposium on. IEEE, 2016. p. 1-2). Only Type-B was found responsible for mobility degradation, which did not saturate with stress time, while the opposite applied to Type A.

There is thus still a need in the art for further improvements of Si-passivated Ge gate stacks.

SUMMARY

It is an object of the disclosure to provide a method for forming a gate stack of a field-effect transistor that overcomes the shortcomings noted above. It is a further object of the disclosure to provide a gate stack, associated with said method, that overcomes the shortcomings noted above. This objective is accomplished by a method and structure according to various example embodiments.

In example embodiments, Ge inclusions in the oxide layer can be reduced or even completely prevented.

In example embodiments, the characteristics of the gate stack (e.g. electron mobility and/or PBTI) can be improved.

In example embodiments, the dimensions of the gate stack can be relatively small (e.g. the Si capping layer therein can have a thickness in the order of 1 nm and below).

In example embodiments, the thermal budget used by the method can be low.

In example embodiments, the method could be compatible with a range of other materials and structures, which may be integrated on the same substrate.

In a first aspect, a method for forming a gate stack of a field-effect transistor is provided. The method includes: (a) depositing a Si capping layer on a Ge channel material; and (b) depositing an oxide layer on the Si capping layer by a plasma enhanced deposition technique at a temperature of 200° C. or below, and a plasma power of 100 W or below, for example, 90 W or below.

In a second aspect, a gate stack is obtainable via the method according to any embodiment of the first aspect.

Particular aspects of the embodiments are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the disclosed embodiments will become apparent from the following detailed description, taken in conjunction with the accompanying drawings, which illustrate, by way of example, the claimed principles. This description is given for the sake of example only, without limiting the scope of the claims. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
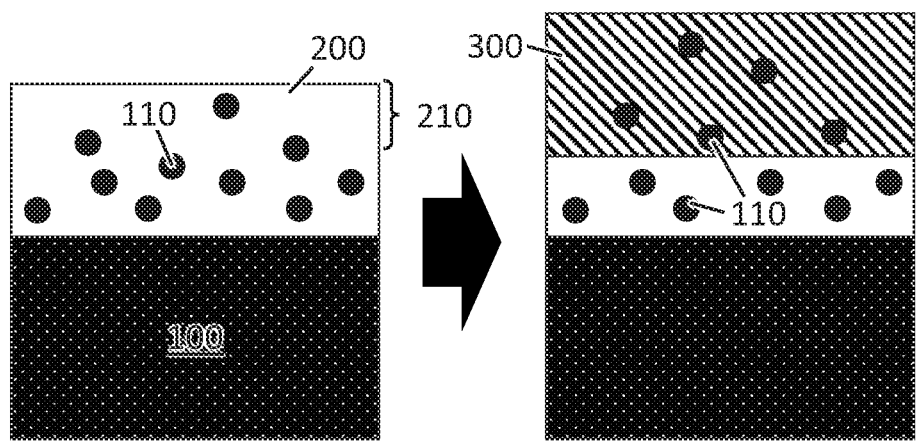
FIG. 1 schematically depicts the oxidation of a top portion of a Si capping layer to form an oxide layer.

In the figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Various embodiments are described below with reference to certain drawings. It is understood that the claims are not to be limited to any particular embodiment. As noted above, the drawings described are only schematic and are non-limiting. In the drawings, the size of some of the elements may be exaggerated and not drawn to scale for illustrative purposes. The dimensions and the relative dimensions do not correspond to actual reductions to practice of any particular embodiment.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to any particular embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various aspects of the disclosure. This method of disclosure, however, is not to be interpreted as reflecting an intention that the claims require more features than are expressly recited in each claim. Rather, as the following claims reflect, aspects may lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to fall within the scope of the claims, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

The following terms are provided as an aid to understand the claims.

As used herein, and unless otherwise specified, a Ge gate stack is a gate stack for use over a Ge channel material. A gate stack may alternatively be referred to as a gate region or control electrode.

In a first aspect, an embodiment relates to a method for forming a gate stack of a field-effect transistor, comprising: (a) depositing a Si capping layer on a Ge channel material; and (b) depositing an oxide layer on the Si capping layer by a plasma enhanced deposition technique at a temperature of 200° C. or below, and a plasma power of 100 W or below, such as 90 W or below.

It was surprisingly realized that the Ge inclusions of segregated Ge channel material (i.e. Type-B electron traps, cf. background) are most problematic when they are incorporated into the oxide layer on the Si capping layer. It was therefore envisioned to deposit a pristine (i.e. free of Ge inclusions) oxide layer on the Si capping layer using deposition conditions under which the oxidation, and thus consumption, of the Si capping layer is minimized.

To achieve this, the oxide layer deposition is performed at a relatively low deposition temperature (in an example, as low as the deposition allows), so as to lower the oxygen diffusivity through the oxide layer. In order to still obtain an oxide layer of high enough quality at such a relatively low temperature, a plasma (e.g. oxygen plasma) enhanced deposition technique is used. Oxidation of the Si capping layer is further reduced by minimizing the amount and kinetic energy of ions and/or radicals (e.g. oxygen ions and/or radicals) originating from the plasma, thereby limiting their penetrating force in the oxide layer during deposition. The kinetic energy of these ions and/or radicals increases with increasing plasma power (i.e. power of plasma generation). Therefore, the plasma power is kept as low as possible.

In embodiments, the Si capping layer may be grown epitaxially on the Ge channel material.

In embodiments, the Si capping layer obtained after step a and before step b may have a thickness of between 0.1 and 2 nm, or between 0.2 and 1 nm, or between 0.3 and 0.7 nm, such as 0.5 nm.

In embodiments, the Si capping layer obtained after step b may have a thickness of between 0.1 and 2 nm, or between 0.2 and 1 nm, or between 0.3 and 0.5 nm, such as 0.4 nm. Since the Ge inclusions are related to segregation of the Ge channel material in the Si capping layer, the negative effect of the Ge inclusions in the oxide layer is exacerbated as the thickness of the Si capping layer reduces; amongst others, because the concentration of the Ge inclusions is highest at the interface between the Si capping layer and the Ge channel material. As such, where a thick Si capping layer can act as a kind of buffer layer for these Ge inclusions, this is not true for a thin Si capping layer. However, a thick Si capping layer has a detrimental effect on electron mobility due to a large proportion of the charge carriers traveling in the Si capping layer instead of in the higher mobility Ge channel. The thickness ranges of this embodiment attempt at striking a compromise between limiting Ge inclusions and assuring a high electron mobility. As such, the embodiments typically provide a greater advantage when the Si capping layer is relatively thin.

In some embodiments, the oxide layer may be a $SiO_2$ layer. In other embodiments, the oxide layer may be made of another oxide, such as an $Al_2O_3$ oxide layer. Trimethylaluminum is a possible precursor for formation of $Al_2O_3$ by PECVD or PEALD. An $SiO_2$ layer may offer a particularly good passivation of the Si capping layer.

In some embodiments, the plasma enhanced deposition technique in step b may be a plasma enhanced chemical vapor deposition (PECVD). In these embodiments wherein PECVD is used, the deposition may be performed at a temperature of 180° C. or below. In embodiments wherein PECVD is used, the deposition may be performed at a plasma power of 90 W or below. In embodiments wherein PECVD is used, the deposition may be performed at a pressure of 10 Torr or below such as 1 Torr or below. In embodiments, a pressure of from 1 to 10 Torr may be used. In embodiments, step b may comprise co-depositing a precursor species and an oxygen species. This can be performed until a desired thickness of the layer is obtained. In embodiments, the precursor species may be a plasma dissociated form (e.g. radials and/or ions) of a metalloid or metal precursor. In some embodiments, the precursor species may be a plasma dissociated form of a silicon precursor (e.g. $SiH_4$, octamethylcyclotetrasiloxane, dichlorosilane, tetraethoxysilane, and other precursors listed below). In embodiments, the oxygen species may be a plasma dissociated form (e.g. radials and/or ions) of an oxidizer (e.g. $O_2$, $N_2O$ or $CO_2$).

In other embodiments, the plasma enhanced deposition technique in step b may be a plasma enhanced atomic layer deposition (PEALD). In embodiments wherein PEALD is used, the deposition may be performed at a temperature of 75° C. or below. For this purpose, the temperature of the substrate may by kept at a temperature of 75° C. or below during the entire step b. In embodiments wherein PEALD is used, the deposition may be performed at a plasma power of 45 W or below. In embodiments wherein PEALD is used, the deposition may be performed at a pressure of 200 Pa or below. In embodiments, step b may comprise: (b1) depositing an atomically thick layer of a precursor, (b2) oxidizing the precursor in an oxygen plasma. Steps (b1) and (b2) may be performed one or more times. In an embodiment, step b may comprise a step (b3) of repeating step (b1) and step (b2) until a desired thickness of the layer is obtained. The precursor (for PEALD or PECVD) is typically a metalloid or metal precursor, such as e.g. a Si precursor. Suitable Si precursors which can be used in this procedure are for example disclosed in US2013115763A1, which is incorporated herein by reference. In some embodiments the silicon precursor may be $SiH_4$. In embodiments, the silicon precursor may be an aminosilane or an aminesilane. In some embodiments the silicon precursor may comprise an aminosilane, where the silicon is bonded to one nitrogen atom and three hydrogen atoms. For example, the silicon precursor may comprise dialkylaminesilane, $(R_2N)SiH_3$. In some embodiments the silicon precursor may comprise a silicon amine, where silicon is bonded to two nitrogen atoms and two hydrogen atoms. For example, the silicon precursor may comprise bis(dialkylamine)silane, $(R_2N)_2SiH_2$. In some embodiments the silicon precursor may comprise bis(diethylamino)silane. In some embodiments the silicon precursor may comprise a silicon amine, where silicon is bonded to three nitrogen atoms and one hydrogen atom. For example, the silicon precursor may comprise tris(dialkylamine)silane, $(R_2N)_3SiH$. In some embodiments, the silicon precursor may comprise a silicon amine, where silicon is bonded to four nitrogen atoms. For example, the silicon precursor may comprise tetrakis(dialkylamine)silane, $(R_2N)_4Si$. Organic compounds having a Si—Si bond and an $NH_x$ group either attached directly to silicon (to one or more silicon atoms) or to a carbon chain attached to silicon are used in some embodiments. In some embodiments, the silicon precursor may comprise an aminodisilane, such as hexakis(ethylamino)disilane. In some embodiments the silicon compound may have the formula:

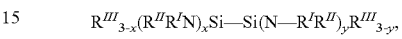

wherein the x is selected from 1 to 3; y is selected from 1 to 3; $R^I$ is selected from the group consisting of hydrogen, alkyl, and substituted alkyl; $R^{II}$ is selected from the group consisting of alkyl and substituted alkyl; and is selected from the group consisting of hydrogen, hydroxide (—OH), amino (—$NH_2$), alkoxy, alkyl, and substituted alkyl; and wherein the each x, y, $R^{III}$ and R' can be selected independently from each other. In some embodiments the silicon compound is hexakis(monoalkylamino)disilane:

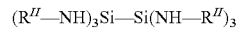

In other embodiments the silicon compound may be $(CH_3O)_3Si$—$Si(O$—$CH_3)_3$. Yet other possible precursors have the formula $Si(OR)_3OH$ with R being a $C_{1-4}$ alkyl group.

To perform step (b2), $O_2$ and a carrier gas such as Ar may be exposed to a plasma in presence of the Si precursor. In embodiments, the $O_2$ and the Ar may be in an atomic ratio of from 0.5:2 to 2:0.5, for instance from 0.8:1.2 to 1.2:0.8, or in a ratio of 1:1. In embodiments, step (b) may comprise (i) continuously flowing $O_2$ and Ar in a chamber; (ii) injecting in the $O_2$ and Ar flow a Si precursor flow (e.g. a Si precursor pulse of from 0.1 to 0.3 s such as 0.2 s); (iii) interrupting the Si precursor flow (e.g. for from 0.2 to 0.4 s, e.g. 0.3 s); and (iv) generating the plasma at a plasma power of 45 W or below (e.g. 45 W), at a pressure of 200 Pa or below, for from 0.05 and 0.2 s (e.g. 0.1 s). Steps (ii)-(iv) may be repeated one or more times.

In embodiments, the method may further comprise a step b' after step b and before step c of annealing the oxide layer (at a temperature from 300° C. to 800° C. for a duration of from 3 min to 5 hours) or of nitridating the oxide layer top surface. Nitridating the oxide layer top surface may for instance be performed by exposing the top surface to a nitrogen source (such as $NH_3$) at a temperature from 400° C. to 800° C. for a duration of from 1 min to 5 hours. As the melting point of Ge is around 900° C., the annealing temperature must be below 900° C. To avoid GeO deposition, a relatively low temperature may be used. Hence, in embodiments, step b' may comprise nitridating the oxide top surface by exposing the top surface to a nitrogen source (such as $NH_3$) at a temperature from 400° C. to 500° C., for instance from 400° C. to 470° C.

To help nitrogen introduction in the oxide layer, a pressure higher than 1 atm can be used. For instance, a pressure higher than 10 atm can be used.

In embodiments, the method may further comprise a step c of forming a high-k dielectric layer on the layer. In embodiments, the high-k dielectric layer may comprise (e.g. consist of) $HfO_2$. In embodiments, the high-k dielectric layer may have a thickness of from 1 to 5 nm, such as 2 nm.

In embodiments, the method may further comprise a step c' after step c and before step d of annealing the oxide layer (at a temperature between 350° C. and 800° C. for a duration of from 30 sec to 5 hours) or of nitridating the high-k dielectric layer top surface. Nitridation can for instance be performed by exposing this top surface to a nitrogen source (such as $NH_3$) at a temperature between 400° C. and 800° C. for a duration of from 1 min to 5 hours. In embodiments, step c' may comprise exposing the top surface of the high-k dielectric to a nitrogen source (such as $NH_3$) at a temperature from 400° C. to 500° C., for instance from 400° C. to 470° C.

To help nitrogen introduction in the high-k layer, a pressure higher than 1 atm can be used. For instance, a pressure higher than 10 atm can be used.

In embodiments, the method may further comprise a step d of forming a barrier layer on the high-k dielectric. In embodiments, the barrier layer may comprise (e.g. consist of) TiN, TaN or a combination thereof. For instance, the barrier layer may be TaN or may be composed of a TiN layer on the high-K dielectric and of a TaN layer on the TiN layer.

In embodiments, the method may further comprise a step e of forming a gate metal on the barrier layer, if present, or on the high-k dielectric if no barrier layer is present. In embodiments, the gate metal may comprise (e.g. consist of) W.

In embodiments, the gate stack may be for use in a field-effect transistor (FET). In embodiments, the field-effect transistor may be an n-channel metal-oxide-semiconductor field-effect transistor (NMOS). In embodiments, the field-effect transistor may further comprise a source region and a drain region. In embodiments, the source region and the drain region may define a channel region therebetween, the channel region being present in the Ge channel material.

In a second aspect, a gate stack is obtainable by the method according to any embodiment of the first aspect. The oxide layer comprised in a gate stack obtainable by the method according to embodiments has typically a Ge content lower than what can be achieved by oxidation of a Si capping layer.

In embodiments, any feature of any embodiment of the second aspect may independently be as correspondingly described for any embodiment of any of the other aspects.

A more detailed description of several embodiments is provided below. It is clear that other embodiments can be configured according to the knowledge of the person skilled in the art and that such embodiments are understood to fall within the spirit and scope of the appended claims.

Comparative Example: Forming a Gate Stack of a FET

We now refer to FIG. 1. An example in accordance with Arimura et al. (2015) (cf. background) was performed. To this end, a thin Si capping layer (200) was epitaxially grown on a Ge channel material (100). Subsequently, a top portion of the Si capping layer was oxidized using a dry $O_3$ oxidation to form a $SiO_2$ oxide layer (300), thereby leaving a minimum required Si capping layer (200) underneath. The optimum remaining Si capping layer thickness was found to be about 0.4 nm. A 0.9 nm thick Si capping layer was therefore initially grown, which left after dry $O_3$ oxidation Si capping layer of about 0.4 nm with a $SiO_2$ interfacial layer of about 1.1 nm thereon. However, by oxidizing the top portion (210) of the Si capping layer (200), Ge inclusions (110) in the Si capping layer (200), segregated from the Ge channel material (100), are incorporated into the $SiO_2$ oxide layer (300). It was found that such Ge (or $GeO_2$) inclusions (110) in oxide layer (300) have a negative impact on the characteristics (e.g. the positive bias temperature instability and/or the electron mobility) of the final FET device.

Example 1: Forming a Gate Stack of a FET in Accordance with an Embodiment

Figure 2:
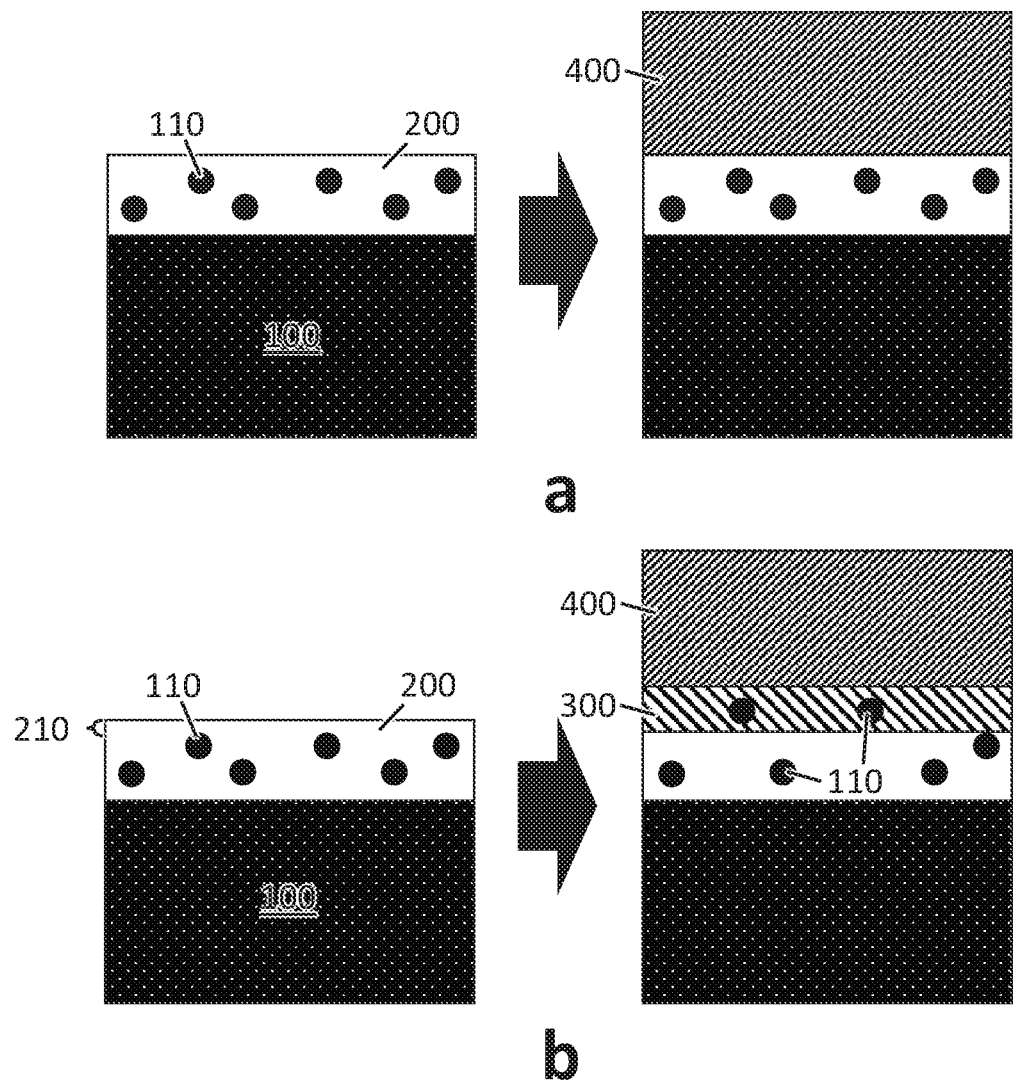
FIG. 2 schematically depicts the deposition of an oxide layer on a Si capping layer, in accordance with an embodiment.

We now refer to FIG. 2. In contrast to the comparative example and FIG. 1, where a top portion (210) of the Si capping layer (200) was oxidized to form the oxide layer (300), a gate stack in accordance with an embodiment was formed by depositing a pristine oxide layer (400) on the as-deposited Si capping layer (200). In doing so, ideally the Si capping layer (200) is not oxidized at all and no Ge inclusions are incorporated into the oxide layer (400); cf. FIG. 2a. Alternatively, a small top portion (210) of the Si capping layer (200) can nevertheless be oxidized to form a thin $SiO_2$ oxide layer (300) with Ge (or $GeO_2$) inclusions (110); cf. FIG. 2b. Regardless, the pristine oxide layer (400) is still free of inclusions and the concentration of these inclusions (110) in the overall oxide layer (300+400) is reduced.

To achieve this, a thin Si capping layer was first epitaxially grown on a Ge channel material; e.g. as described by Loo et al. (LOO, R., et al. Editors' Choice—Epitaxial CVD Growth of Ultra-Thin Si Passivation Layers on Strained Ge Fin Structures. *ECS Journal of Solid State Science and Technology*, 2018, 7.2: P66-P72), which is incorporated herein by reference. In view of the limited Si capping layer consumption in the embodiments during deposition of the oxide layer, an initial Si capping layer of about 0.5 nm thick can be sufficient to obtain a remaining Si capping layer in the final gate stack of about 0.4 nm thick.

A $SiO_2$ oxide layer was then deposited on the Si capping layer by either of two plasma-assisted deposition methods as outlined below. Alternatively, the oxide layer could be made of another oxide material, such as $Al_2O_3$.

Subsequently, a high-k dielectric layer (e.g. $HfO_2$) was deposited on the oxide layer to reduce gate leakage current. To improve the high-k/$SiO_2$ layer quality and thermal stability, nitridation of the $SiO_2$ surface as such or of the high-k/$SiO_2$ stack and/or a post-deposition annealing of the high-k dielectric layer can be performed. A barrier layer (e.g. TiN or TaN or their combination) and a gate metal (e.g. W) can be further deposited thereon using procedures as are known in the art.

Example 1a: Depositing the Oxide Layer by Plasma Enhanced Chemical Vapor Deposition, in Accordance with an Embodiment A $SiO_2$ oxide layer was deposited by a plasma enhanced chemical vapor deposition (PECVD), in which a silicon precursor (e.g. $SiH_4$) and an oxidizer (e.g. $O_2$, $N_2O$ or $CO_2$) are simultaneously dissociated in the plasma. Silicon and oxygen radicals and ions then continuously combine to form a $SiO_2$ film. Typical process parameters used were a pressure of 1-10 Torr, a plasma power of 90 W and a temperature of 180° C.

Example 1b: Depositing the Oxide Layer by Plasma Enhanced Atomic Layer Deposition, in Accordance with an Embodiment Alternatively, the $SiO_2$ oxide layer was deposited by a plasma enhanced atomic layer deposition (PEALD). A selflimiting and atomically thick layer of a Si precursor was therefore first deposited; followed by oxidation in an oxygen plasma. In this latter step, the plasma power was not only low, but the plasma duration was also kept short. These two steps of layer deposition followed by plasma exposure were then continuously repeated until the desired thickness was obtained. During this cycle, the substrate temperature was kept at 75° C. $O_2$ and Ar in a ratio of 1:1 were continuously flowing in which the Si precursor was injected with an Ar flow for 0.2 s (i.e. the Si precursor pulse). Next, the Si precursor flow was stopped for 0.3 s (i.e. the Si precursor purge) and the plasma was switched on at a plasma power of 45 W for 0.1 s. The chamber pressure was typically maintained at 200 Pa. Suitable Si precursors which can be used in this procedure are for example disclosed in US2013115763A1, particularly [0130-144], which is incorporated herein by reference. The Si precursor could for example be bis(diethylamino)silane (BDEAS).

It is to be understood that although certain embodiments, specific constructions and configurations, as well as materials, have been discussed herein for devices, various changes or modifications in form and detail may be made without departing from the spirit and scope of the claims. For example, any formulas given above are merely representative of procedures that may be used. Functionality may be added or deleted from the block diagrams and operations may be interchanged among functional blocks. Steps may be added or deleted to methods. Such modified implementations are understood to fall within the spirit and scope of the claims.

What is claimed is:

1. A method for forming a gate stack of a field-effect transistor, comprising:
    depositing a Si capping layer on a Ge channel material; and
    configuring a thickness of the Si capping layer to maximize electron mobility in the Ge channel material and to minimize Ge inclusions in a deposited oxide layer by depositing the oxide layer on the Si capping layer by a plasma enhanced deposition technique at a temperature of 200° C. or below, and a plasma power of 100 W or below.

2. The method according to claim 1, wherein the oxide layer is a $SiO_2$ layer.

3. The method according to claim 1, wherein the Si capping layer obtained after depositing the oxide layer on the Si capping layer has a thickness of between 0.1 and 2 nm.

4. The method according to claim 1, wherein the Si capping layer obtained after depositing the oxide layer on the Si capping layer has a thickness of between 0.2 and 1 nm.

5. The method according to claim 1, wherein the plasma enhanced deposition technique corresponds to a plasma enhanced chemical vapor deposition or a plasma enhanced atomic layer deposition.

6. The method according to claim 5, wherein the plasma enhanced deposition technique is a plasma enhanced atomic layer deposition performed at a temperature of 75° C. or below.

7. The method according to claim 6, wherein depositing the oxide layer on the Si capping layer by a plasma enhanced deposition technique at a temperature of 200° C. or below is performed at a plasma power of 45 W or below.

8. The method according to claim 6, wherein depositing the oxide layer on the Si capping layer by a plasma enhanced deposition technique at a temperature of 200° C. or below is performed at a pressure of 200 Pa or below.

9. The method according to claim 5, wherein depositing the oxide layer on the Si capping layer is performed at a plasma power of 45 W or below.

10. The method according to claim 5, wherein depositing the oxide layer on the Si capping layer is performed at a pressure of 200 Pa or below.

11. The method according to claim 5, wherein depositing the oxide layer on the Si capping layer comprises:
    repeatedly depositing an atomically thick layer of a precursor, and oxidizing the precursor in an oxygen plasma until a desired thickness of the layer is obtained.

12. The method according to claim 1, further comprising forming a high-k dielectric layer on the layer.

13. The method according to claim 12, wherein the high-k dielectric layer comprises $HfO_2$.

14. The method according to claim 12, further comprising forming a barrier layer on the high-k dielectric.

15. The method according to claim 12, further comprising forming a gate metal on a barrier layer, if present, or on the high-k dielectric if no barrier layer is present.

16. The method according to claim 12, further comprising forming a barrier layer on the high-k dielectric.

17. The method according to claim 16, wherein the barrier layer comprises TaN.

18. The method according claim 12, further comprising forming a gate metal on a barrier layer, if present, or on the high-k dielectric if no barrier layer is present.

19. The method according to claim 18, wherein the gate metal comprises W.

20. A gate stack obtainable by the method of claim 1.

* * * * *